(12) United States Patent
Pisau et al.

(10) Patent No.: US 10,516,347 B1
(45) Date of Patent: Dec. 24, 2019

(54) LOAD DETECTION METHOD AND APPARATUS

(71) Applicant: Omron Automotive Electronics Co., Ltd., Aichi (JP)

(72) Inventors: Lucretiu Pisau, Highland Park, IL (US); Sudarshan Ravindran, Saint Charles, IL (US); Srivatsan Jayaramasundaram, Naperville, IL (US)

(73) Assignee: Omron Automotive Electronics Co., Ltd., Aichi (JP)

( * ) Notice: Subject to any disclaimer, the term of this patent is extended or adjusted under 35 U.S.C. 154(b) by 0 days.

(21) Appl. No.: 16/366,581

(22) Filed: Mar. 27, 2019

(51) Int. Cl.
| | |
|---|---|
| *H02M 7/5387* | (2007.01) |
| *H02M 1/08* | (2006.01) |
| *G01R 15/14* | (2006.01) |
| *G01R 15/04* | (2006.01) |
| *G01R 19/10* | (2006.01) |

(52) U.S. Cl.
CPC ........ *H02M 7/53873* (2013.01); *G01R 15/04* (2013.01); *G01R 15/146* (2013.01); *G01R 19/10* (2013.01); *H02M 1/08* (2013.01)

(58) Field of Classification Search
CPC ........... H02M 7/5387; H02M 7/53871; H02M 7/53873; H02M 1/08; G01R 15/04; G01R 15/146; G01R 19/10
USPC ................................ 363/17, 37, 95–98, 109
See application file for complete search history.

(56) References Cited

U.S. PATENT DOCUMENTS

| | | | |
|---|---|---|---|
| 3,781,495 A | 12/1973 | Splingaerd | |
| 3,824,441 A * | 7/1974 | Heyman | ............ H02M 3/3155 363/37 |
| 4,947,278 A | 8/1990 | Nichols | |
| 5,003,486 A | 3/1991 | Hendel et al. | |
| 5,095,182 A | 3/1992 | Thompson | |
| 5,224,879 A | 7/1993 | Mullins et al. | |
| 5,267,116 A | 11/1993 | Avitan | |
| 5,374,199 A | 12/1994 | Chung | |
| 5,426,552 A | 6/1995 | Avitan | |

(Continued)

FOREIGN PATENT DOCUMENTS

| | | |
|---|---|---|
| AU | 6027290 A | 6/1992 |
| CA | 2113915 A1 | 7/1994 |

(Continued)

*Primary Examiner* — Yemane Mehari
(74) *Attorney, Agent, or Firm* — Murphy, Bilak & Homiller, PLLC

(57) ABSTRACT

Safe detection of an external load attached to an AC power outlet of a power supply stands out as one advantage of the power supply apparatus and method contemplated herein, although other advantages flow therefrom. Not least among the other advantages are a simplicity of design offering an economical and robust mechanism for detecting external loads. The contemplated mechanism relies on the application of a DC voltage to one electrical phase of the AC power outlet and the coupling of that voltage to the other electrical phase of the AC power outlet through an interconnecting resistor. With both phases respectively coupled to voltage divider circuits nominally matched in value, the divided down voltages measured from the respective phases will differ in dependence on the relative size of the interconnecting resistor and the resistive value of any load attached to the AC power outlet.

21 Claims, 5 Drawing Sheets

(56) References Cited

U.S. PATENT DOCUMENTS

| | | | |
|---|---|---|---|
| 5,485,340 A | 1/1996 | Avitan | |
| 5,865,635 A | 2/1999 | Hsiang et al. | |
| 5,984,700 A | 11/1999 | Chang | |
| 6,495,775 B2 | 12/2002 | Lawson et al. | |
| 6,528,957 B1 * | 3/2003 | Luchaco | H05B 37/034 307/31 |
| 6,552,888 B2 * | 4/2003 | Weinberger | H01R 13/713 307/125 |
| 6,984,141 B1 | 1/2006 | Beski et al. | |
| 7,304,461 B2 | 12/2007 | Watanabe et al. | |
| 7,505,237 B2 | 3/2009 | Baxter | |
| 7,556,513 B2 | 7/2009 | Ng et al. | |
| 7,978,447 B2 | 7/2011 | Baxter | |
| 8,072,177 B2 * | 12/2011 | Arisawa | H02P 8/22 318/611 |
| 8,175,463 B2 | 5/2012 | Elberbaum | |
| 8,625,307 B2 * | 1/2014 | Iwata | H02M 7/49 363/17 |
| 8,797,202 B2 * | 8/2014 | Zhu | G01R 19/0084 330/252 |
| 2006/0125434 A1 | 6/2006 | Frohne et al. | |
| 2007/0096765 A1 * | 5/2007 | Kagan | G01R 22/063 455/41.2 |
| 2008/0049367 A1 * | 2/2008 | Carson | H02H 3/12 361/87 |
| 2008/0238406 A1 * | 10/2008 | Banhegyesi | G01D 4/004 324/120 |
| 2011/0068819 A1 * | 3/2011 | Sims | G01R 31/40 324/764.01 |

FOREIGN PATENT DOCUMENTS

| | | |
|---|---|---|
| WO | 9417573 A1 | 8/1994 |
| WO | 2005020406 A1 | 3/2005 |

\* cited by examiner

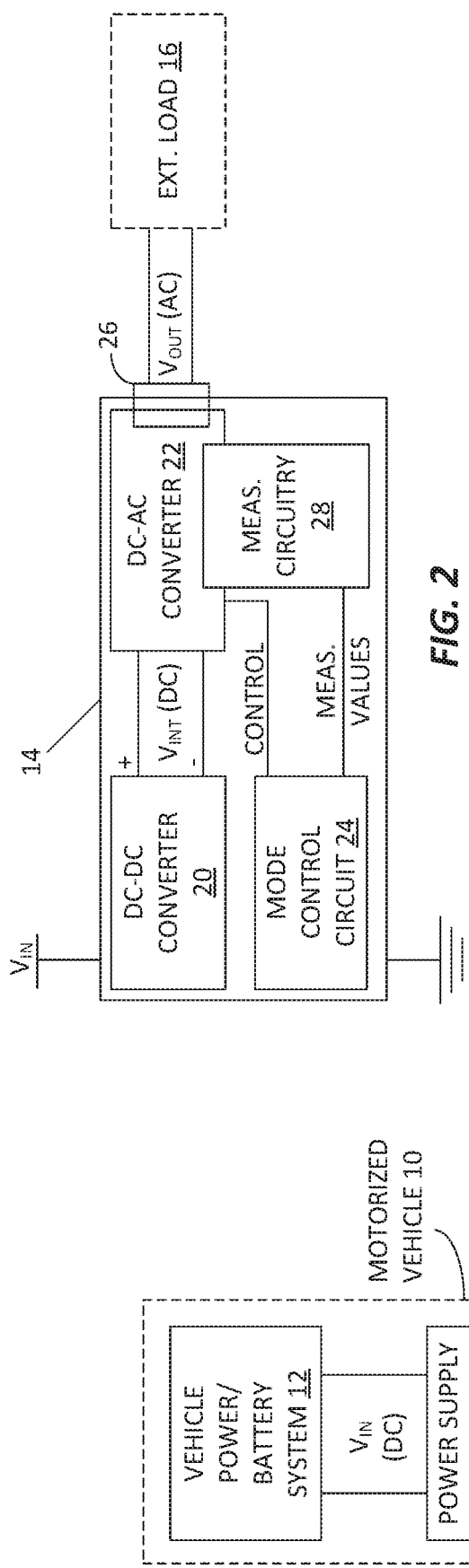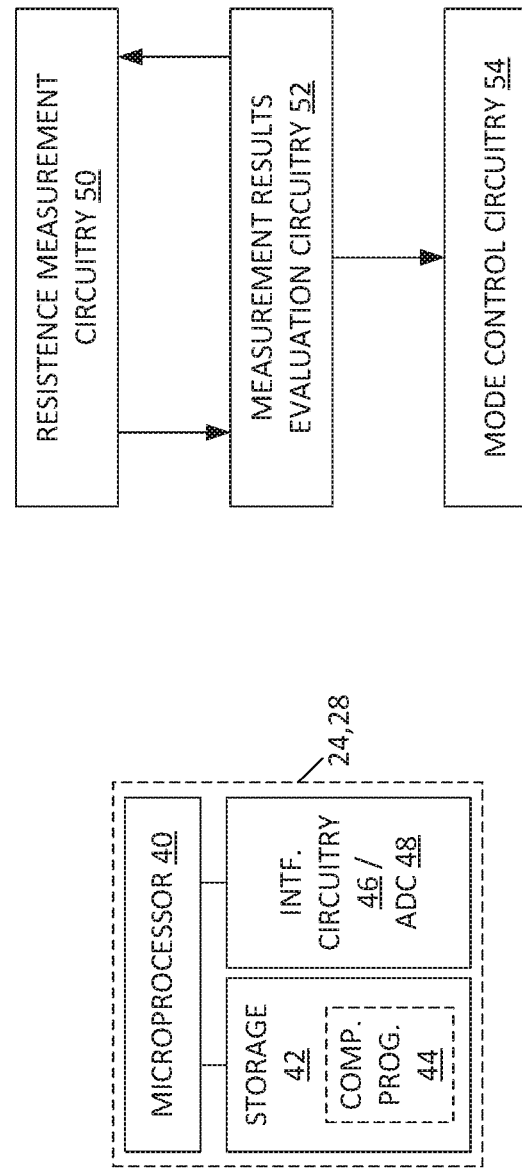

LOAD DETECTION METHOD AND APPARATUS

TECHNICAL FIELD

The invention relates to power supplies and, particularly, to detecting when the power output of a power supply is loaded.

BACKGROUND

An example power supply configured for onboard use in a vehicle provides an AC output voltage, e.g., nominally set at 115 VAC or at 230 VAC. Conventionally, the power supply is off when the vehicle is off and on when the vehicle is on. A further refinement aims for reducing wasted power while the vehicle is on, by turning the power supply off if it is not being used.

In one example, the AC outlet of the power supply includes a mechanical arrangement that is actuated by insertion of the prongs of a power cord into the outlet. Such arrangements can be made reliable but suffer from at least two drawbacks. First, mechanical detection of plug insertion adds significant design and manufacturing complexity to the outlet. Second, mechanical detection of the plug is not equivalent to detecting whether there is an electrical load attached to the outlet. Plugging in an extension cord with nothing plugged into its other end triggers the mechanical detection as surely as plugging in a laptop computer or other electrical load.

Other approaches may rely on higher-level data communications to enable and disable the power supply, e.g., involving messages carried on one or more information busses within the vehicle. To the extent that the designer of a power supply might aim for actual detection of the loading on the AC outlet, that approach raises a complex mix of challenges relating to safety-of-design, reliability, and complexity.

SUMMARY

Safe detection of an external load attached to an AC power outlet of a power supply stands out as one advantage of the power supply apparatus and method contemplated herein, although other advantages flow therefrom. Not least among the other advantages are a simplicity of design offering an economical and robust mechanism for detecting external loads. The contemplated mechanism relies on the application of a DC voltage to one electrical phase of the AC power outlet and the coupling of that voltage to the other electrical phase of the AC power outlet through an interconnecting resistor. With both phases respectively coupled to voltage divider circuits nominally matched in value, the divided down voltages measured from the respective phases will differ in dependence on the relative size of the interconnecting resistor and the resistive value of any load attached to the AC power outlet.

In an example embodiment, a method of operating a power supply apparatus involves a first mode of operation. The power supply apparatus has an AC power outlet and, in the first mode of operation, the AC power outlet is maintained in an off state by the power supply apparatus. The method includes applying a DC voltage to the top of a first resistive voltage divider coupling a first electrical phase of the AC power outlet to a reference ground, and applying the DC voltage through an interconnecting resistor to the top of a second resistive voltage divider coupling a second electrical phase of the AC power outlet to the reference ground.

The second resistive voltage divider nominally matches the first resistive voltage divider, and the interconnecting resistor imposes a voltage drop between the tops of first and second resistive voltage dividers that increases in the presence of an external resistive load plugged into the AC power outlet. Correspondingly, the method includes measuring DC voltages from corresponding measurement points of the first and second resistive voltage dividers, comparing the measured DC voltages, and transitioning the AC power outlet from the first mode of operation to a second mode of operation in which the AC power outlet is on, in dependence on the comparison of the measured DC voltages.

In another example embodiment, a power supply apparatus includes an AC power outlet having first and second electrical phases and further includes measurement circuitry. The measurement circuitry includes coupling circuitry configured to apply a DC voltage to the first phase of the AC power outlet, at least during a first mode of operation of the power supply apparatus in which the AC power outlet is off. The apparatus further includes first and second resistive dividers.

The first resistive voltage divider couples the first electrical phase to a reference ground while the second resistive voltage divider couples the second electrical phase to the reference ground. The second resistive divider is matched to the first resistive voltage divider, at least nominally. According to an advantageous arrangement, the second electrical phase is interconnected to the first electrical phase via an interconnecting resistor that imposes a voltage drop between the tops of first and second resistive voltage dividers that increases in the presence of an external resistive load plugged into the AC power outlet. Circuitry within the apparatus is configured to measure DC voltages from corresponding measurement points of the first and second resistive voltage dividers. Control circuitry of the apparatus is configured to transition the power supply apparatus from the first mode of operation to a second mode of operation in which the AC power outlet is on, in dependence on comparing the measured DC voltages.

Of course, the present invention is not limited to the above features and advantages. Those of ordinary skill in the art will recognize additional features and advantages upon reading the following detailed description, and upon viewing the accompanying drawings.

BRIEF DESCRIPTION OF THE DRAWINGS

FIG. 1 is a block diagram of one embodiment of a power supply apparatus onboard a motorized vehicle.

FIG. 2 is a block diagram illustrating example details for a power supply apparatus.

FIG. 3 is a block diagram illustrating an example implementation of certain control circuitry of a power supply apparatus using a microprocessor and supporting circuitry.

FIG. 4 is a block diagram illustrating an example functional configuration of a power supply apparatus.

DETAILED DESCRIPTION

Figure 5:
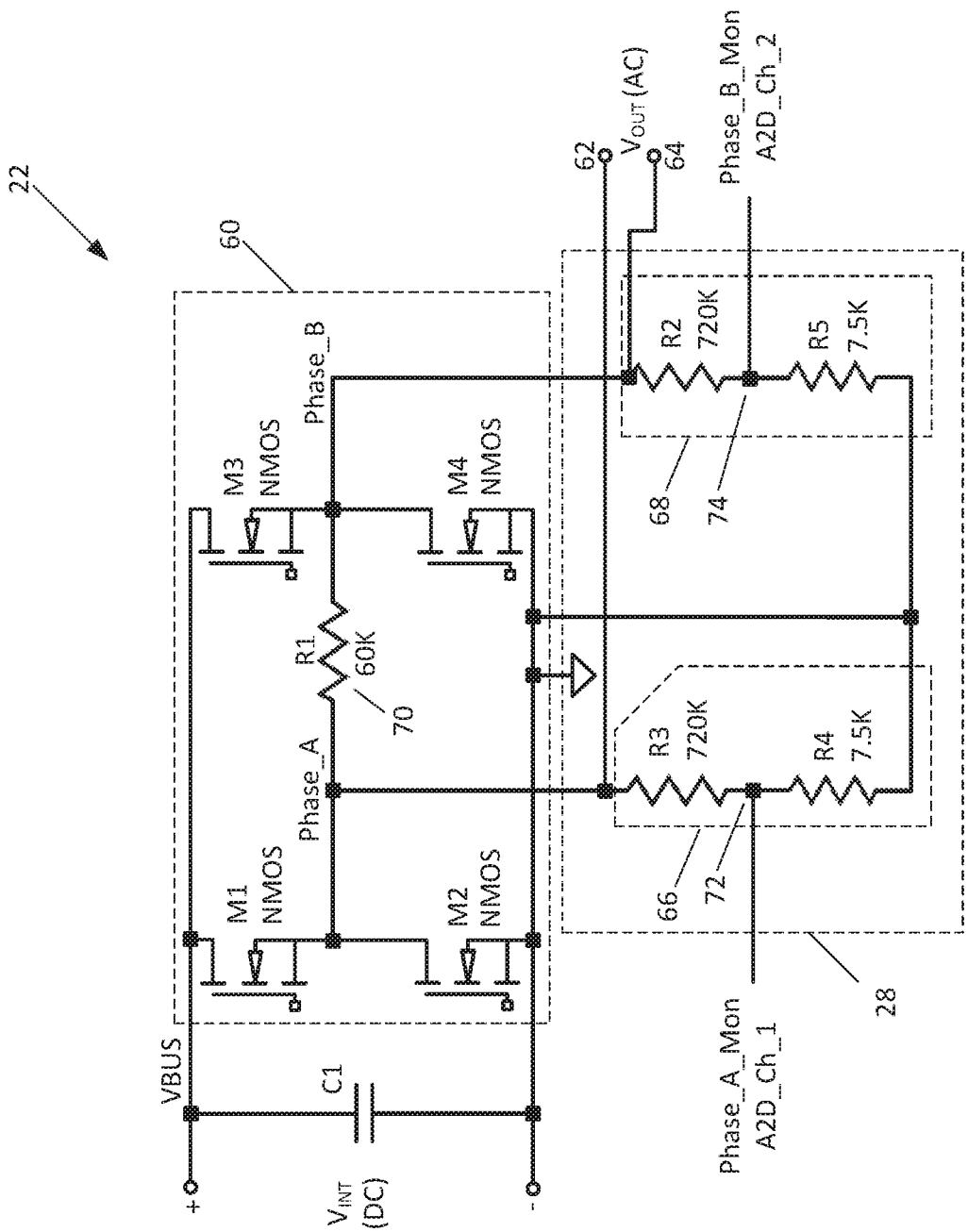
FIG. 5 is a schematic diagram of example DC-to-AC circuitry of a power supply apparatus.

A motorized vehicle 10 appears in simplified form in FIG. 1, and feature illustrations of the vehicle 10 are limited to the depiction of a power or battery system 12 that provides a DC voltage, for powering various loads onboard the vehicle 10. As non-limiting examples, the power or battery system 12 provides a DC voltage having a nominal voltage of 12 VDC, 24 VDC, or 48 VDC.

A power supply apparatus 14 is onboard the vehicle 10, or, at least is designed for onboard operation, meaning that the power supply apparatus 14 is designed to use the power or battery system 12 of the vehicle 10 as its input power source for generating an AC output voltage—$V_{OUT}$ (AC)— for powering an external load 16. While not a limiting use-case or configuration, the vehicle 10 is a passenger vehicle and the power supply apparatus 14 provides power for one or more AC-powered devices (loads) used by occupants of the vehicle 10, such as laptops, tablets, smartphones, video players, etc.

For various reasons, keeping the power supply apparatus 14 off or otherwise in a lowered state of power consumption may be desirable. One mechanism for lowering its consumption depends on disabling at least the AC output from the power supply apparatus 14 and, at least when implemented as disclosed herein, disabling the AC output enhances the safety of power supply apparatus 14 by keeping the AC output de-energized when no external load 16 is connected.

FIG. 2 illustrates example details for implementing the power supply apparatus 14—apparatus 14, hereafter. A DC-to-DC converter 20 receives the input DC voltage ($V_{IN}$) from the vehicle power supply or battery system and generates from it an intermediate DC voltage ($V_{INT}$) that is stepped up or boosted, in comparison to $V_{IN}$. A DC-to-AC converter 22 generates the output AC voltage ($V_{OUT}$) from $V_{INT}$. Correspondingly, in an example configuration, a mode control circuit 24 controls the DC-to-AC converter 22 such that the apparatus 14 selectively operates in a first mode where the DC-to-AC converter 22 is disabled and an AC power outlet 26 of the apparatus 14 is de-energized, or in a second mode where the DC-to-AC converter 22 is enabled and the AC power outlet 26 is energized.

Mode control depends on load detection, wherein the apparatus 14 keeps the AC power outlet 26 de-energized unless it detects an external load 16. Here, "detection" of an external load 16 may be conditioned on the external load 16 meeting a minimum load size, e.g., falling with a certain range of DC resistance, such that the external load 16 draws sufficient current with respect to the measurement circuitry 28 used for load detection.

FIG. 3 introduces an example arrangement wherein the foregoing functionality is realized at least in part using microprocessor-based circuitry. Particularly, the diagram depicts at least the mode control circuit 24 and the measurement circuitry 28 implemented via a microprocessor 40, one or more storage circuits or devices (storage 42), and interface circuitry 46, which may include an analog-to-digital converter (ADC) 48 having one or more channels for converting analog voltages to digital values. In at least one embodiment, the microprocessor 40 integrates at least part of the interface circuitry 46. e.g., the microprocessor 40 includes at least one ADC channel and one or more lines of discrete I/O, such as may be used for selecting whether the apparatus 14 operates in the first or second modes.

FIG. 4 depicts key circuitry of the apparatus 14 from a measurement and control perspective, illustrating resistance measurement circuitry 50, measurement results evaluation circuitry 52, and mode control circuitry 54. In one or more embodiments, at least some of this circuitry is functionally realized via the microprocessor 40, e.g., based on executing computer program instructions in one or more computer programs 44 held in the storage 42.

In that regard, the storage 42 comprises one or more types of memory circuits or storage devices and, as a general proposition operates as computer-readable media, for at least temporarily retaining computer program instructions (and, possibly, associated working data) for execution by the microprocessor 40. Of course, implementation via other processing arrangements is contemplated, such as via one or more Field Programmable Gate Arrays (FPGAs), Application Specific Integrated Circuits (ASICs), or other arrangements of digital processing circuitry.

The resistance measurement circuitry 50 is configured to obtain resistance measurements for respective electrical phases of the DC-to-AC converter's output, where those measurements indicate whether an external electrical load 16 is connected to the AC power outlet 26. The measurement results evaluation circuitry 52 is configured to evaluate the measurements obtained by the circuitry 50, e.g., to compare the resistance measurements made for the respective electrical phases of the DC-to-AC converter's output. Here, the term "resistance measurement" should be understood as broadly encompassing voltage measurements that are dependent upon the resistance. The mode control circuitry 54, in turn, controls the mode of the apparatus 14 in dependence on the measurement evaluation, e.g., by switching the apparatus from the first mode to the second mode, in dependence on the measurement evaluation indicating that an external load 16 is plugged into the AC power outlet 26.

FIG. 5 illustrates an example embodiment of the apparatus 14, focusing on the DC-to-AC converter 22 and at least a portion of the measurement circuitry 28. One sees a transistor bridge circuit 60 used to generate the output AC voltage $V_{OUT}$ from the intermediate DC voltage $V_{INT}$, as supplied by the DC-to-DC converter 22—introduced in FIG. 2. Notably, the DC-to-AC converter 22 may be held in a disabled state for operation of the apparatus 14 in the first mode, whereas the DC-to-DC converter 20 may remain in continuous operation or be activated periodically or on a triggered basis, to provide the DC voltage—$V_{INT}$—that is used for load detection.

In any case, the transistor bridge 60 includes transistors M1-M4 in an H-bridge configuration, where the transistors are, for example, N-channel MOSFETs. The two electrical phases of the AC output are marked Phase_A and Phase_B and are made available on respective outputs 62 and 64, which may be electrically tied to the receptacle connections of the AC power outlet 26 into which users plug external loads 16.

A first resistive voltage divider 66 couples the first electrical phase (Phase_A) to a circuit "ground," and a second resistive voltage divider 68 likewise couples the second electrical phase (Phase_B) to the circuit ground. The first resistive voltage divider 66 includes a series arrangement of two resistors R3 and R4, with a measurement point 72 situated at the node connecting them in series. The second resistive voltage divider 68 also includes a series arrangement of two resistors, referenced here as R2 and R5, with a measurement point 74 situated at the node connecting them in series.

The second resistive voltage divider 68 is "matched" to the first resistive voltage divider 66, at least nominally. "Matched" in this regard means that the two resistive dividers 66 and 68 used the same sizes of resistors, or at least have the same divider ratio. Because the two resistive dividers have the same divider ratio, applying the same DC voltage to the tops of the two resistive dividers 66 and 68 produces the same divided-down voltage at the respective measurement points 72 and 74, at least within the involved tolerance values of the resistors R3 and R4 and R2 and R5.

However, rather than applying the same voltage to tops of both resistive dividers 66 and 68, the depicted arrangement does something clever to enable safe, reliable detection of an external load 16 connected to the AC power outlet 26 of the apparatus 14. Namely, an interconnecting resistor 70 couples the second electrical phase (Phase_B) to the first electrical phase (Phase_A) and produces a voltage drop between the phases when an external load 16 is present on the AC power outlet 26.

To make measurements that indicate whether an external load 16 is attached, the mode control circuit 24 or the measurement circuitry 28 at least temporarily turns on the DC-to-DC converter 20 and the transistor M1. Those actions apply the intermediate DC voltage $V_{INT}$ generated by the DC-to-DC converter 20 to the first electrical phase (Phase_A) of the AC output. Here, that voltage is shown as $V_{BUS}$. The DC voltage appearing at the measurement point 72 of the first resistive voltage divider 66 is, therefore, given as $V_{72}=V_{BUS}*R3/(R3+R4)$.

Now consider the DC voltage appearing at the measurement point 64 of the second resistive voltage divider 68. In a first case where no external load 16 is plugged into the AC power outlet 26, the voltage appearing at the measurement point 74 differs from the voltage appearing at the corresponding measurement point 72 of the first resistive divider 66 because the top of the second resistive divider 68 does not see the full value of $V_{BUS}$. Instead, the voltage at the top of the second resistive divider 68 is $V_{BUS}-V_{DROP}(R1)$, where $V_{DROP}(R1)$ denotes the voltage drop across the interconnecting resistor 70 (also denoted as R1), which connects Phase_A to Phase_B. Another way to look at the arrangement is to consider R1 as part of the second resistive divider 68 and express the measurement voltage at the measurement point 74 as $V_{74}=VBUS*(R1+R2)/(R1+R2+R5)$.

Thus, when no external load 16 is plugged into the AC power outlet 26, there will be a slight difference between the measurement voltage $V_{72}$ and the measurement voltage $V_{74}$, with the difference being attributable to the series resistance between Phase_A and Phase_B, imposed by the interconnecting resistor 70. However, when an external load 16 is plugged into the AC power outlet 26, the DC resistance of the external load 16 appears in parallel with the second resistive divider 68, meaning the difference between the measurement voltages $V_{72}$ and $V_{74}$ becomes larger.

Notably, the resistance values depicted in the figure are advantageous values, for at least some applications, but the depicted values are non-limiting. At least three nice features or characteristics flow from the foregoing arrangement. First, the arrangement is safe in the sense that only DC voltages of relatively low magnitude are output from the AC power outlet 26 for load detection. Second, because large resistances can be used, very little power is expended in the resistive dividers 66 and 68. Third, the minimum detectable "size" of external loads can be configured as desired by sizing the interconnecting resistor 70.

For example, the apparatus 14 can be configured to detect external loads of 500 milli-Watts or above. This feature allows the apparatus 14 to ignore, for example, an extension cord that is plugged into the AC power outlet 26, unless or until a resistive load is attached to the extension cord. Of course, the threshold for load detection can be lowered or raised, in dependence on the application or requirements at hand.

Figure 6:
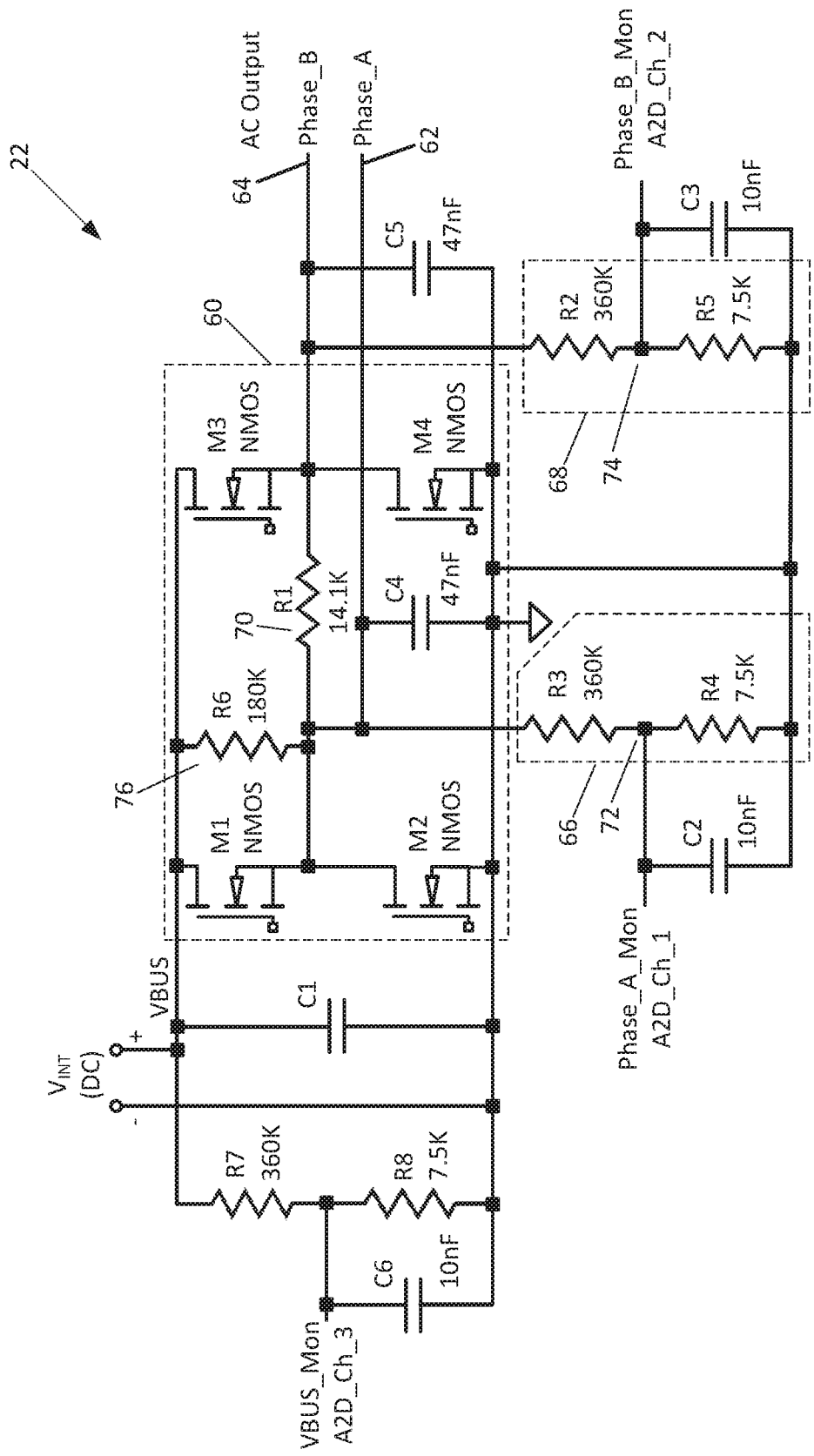
FIG. 6 is a schematic diagram of another example of DC-to-AC circuitry of a power supply apparatus.

FIG. 6 illustrates another exemplary embodiment of the apparatus 14, again focusing on the DC-to-AC converter 22 and the resistive voltage dividers 66 and 68. In differentiation from the arrangement depicted in FIG. 5, a resistor 76 (also labeled as R6) couples $V_{BUS}$ to Phase_A of the AC output. At least two nice attributes flow from the addition of the resistor 76; namely, the need to turn on the transistor M1 to apply a DC voltage to Phase_A is obviated, and the resistor 76 serves as an additional series resistance for limiting the DC current flowing in or through the output circuitry of the apparatus 14 for load detection.

With the above non-limiting examples in mind, a power supply apparatus 14 in a contemplated arrangement includes an AC power outlet 26 having first and second electrical phases, e.g., Phases A and B as illustrated in FIGS. 5 and 6. Of course, it will be appreciated that the disclosed technique for detecting when an external load 16 is connected to the AC power outlet 26 may be extended to more than two phases, e.g., in a multi-phase output arrangement.

In any case, the apparatus 14 includes measurement circuitry 28. The measurement circuitry 28 includes coupling circuitry configured to apply a DC voltage to the first phase of the AC power outlet 26, at least during a first mode of operation of the apparatus 14 in which the AC power outlet 26 is off. By way of example, FIG. 5 illustrates that the coupling circuitry may be one of the transistors of the H-bridge 60 used for generation of the AC voltage output from the apparatus 14. e.g., the high-side transistor M1 associated with Phase_A of the AC output is turned on, to apply the intermediate DC voltage $V_{INT}$ (or $V_{BUS}$) to Phase_A. Here, the DC-to-DC converter 20 generates $V_{INT}$ from the input voltage $V_{IN}$. FIG. 6 illustrates another possibility, in which a resistor 76 in a shunt configuration provides passive, resistive coupling of $V_{BUS}$ to Phase_A.

Thus, the step or operation of the apparatus 14 "applying" a DC voltage to a first electrical phase of the AC output may or may not involve active control by the apparatus 14. That is, the application may occur automatically, whenever $V_{BUS}$ is present, i.e., whenever the DC-to-DC converter 20 is active and the output bridge 60 is inactive.

The measurement circuitry 28 further includes a first resistive voltage divider 66 coupling the first electrical phase (Phase_A) to a reference ground, and a second resistive voltage divider 68 coupling the second electrical phase (Phase_B) to the reference ground. The second resistive divider 68 is matched to the first resistive voltage divider 66 and is interconnected to the first electrical phase via an interconnecting resistor 70 that imposes a voltage drop between the tops of first and second resistive voltage dividers 66 and 68. As noted, the voltage drop increases in the presence of an external load plugged into the AC power outlet 26.

As noted, the measurement circuitry 28 is configured to measure DC voltages from corresponding measurement points 72 and 74 of the first and second resistive voltage dividers 66 and 68. The mode control circuitry 24 is configured to transition the apparatus 14 from the first mode of operation to a second mode of operation in which the AC power outlet 26 is on, in dependence on comparing the measured DC voltages. That is, assuming that the apparatus 14 is in the first mode, which may be a default or power-on mode, for example, the mode control circuitry 24 transitions the apparatus 14 to the second mode of operation, in response to detecting the presence of an external load 16 plugged into the AC power outlet 26.

In an example implementation, the mode control circuitry 24 is configured to control the transition by determining whether the difference between the measured DC voltages exceeds a threshold and, responsive to the threshold being exceeded, transitioning the apparatus 14 from the first mode to the second mode. Referring to FIGS. 5 and 6, for example, the control circuitry 24 transitions the apparatus 14 to the second mode in response to detecting that the difference between the voltages $V_{72}$ and $V_{74}$ exceeds a defined threshold. Again, the threshold may be set to reflect a minimum load size desired for activation of the AC output. That is, the value of the threshold corresponds to a minimum size of external load 16, in one or more embodiments of the apparatus 14.

The circuitry 28 configured to measure the DC voltages includes, for example, an analog-to-digital converter configured to convert analog voltages for the corresponding measurement points 72 and 74 into corresponding digital counts. Correspondingly, the mode control circuitry 24 is configured to compare the digital counts, to determine whether the difference between the corresponding digital counts exceeds a count threshold. As one example of the measurement circuitry 28 and/or mode control circuitry 24, the microprocessor 40 shown in FIG. 3 includes or is associated with an analog-to-digital converter 48, preferably having two channels, for converting the respective measurement voltages $V_{72}$ and $V_{74}$ into digital counts, for evaluation by the microprocessor 40.

As noted above, the coupling circuitry used to apply a DC voltage to the first electrical phase of the AC output may be a high-side transistor of the H-bridge 60 used for producing the AC output voltage. With the H-bridge 60 inactive, the mode control circuitry 24 activates the high side transistor for the first electrical phase of the AC power outlet 26, to couple that phase to the intermediate DC voltage internally generated within the apparatus 14. Again, the intermediate DC voltage may be continuously generated via the DC-to-DC converter 20 while the apparatus 14 operates in the first mode. Alternatively, operation in the first mode may include periodic activation of the DC-to-DC converter 20 according to some duty cycle reflecting how quickly the presence of an external load 16 should be detected by the apparatus 14, once the load is plugged into the AC power outlet 26. With periodic activation, the control circuitry 24 turns on the DC-to-DC converter 20 and then compares the corresponding voltage measurements obtained from the first and second resistive dividers 66 and 68. e.g., after allowing transient conditions associated with activating the DC-to-DC converter 20 to settle.

Thus, in at least one embodiment, the mode control circuitry 24 is configured to activate the high-side transistor periodically while the apparatus 14 operates in the first mode, for periodically detecting whether an external load 16 of at least a minimum load size is plugged into the AC power outlet 26. Correspondingly, the mode control circuitry 24 is configured to synchronize measurements of the DC voltage from the corresponding measurement points 72 and 74 of the first and second resistive voltage dividers 66 and 68 with the periodic activations of the high-side transistor.

A period of the periodic activations of the high-side transistor corresponds to a targeted response time for detecting that an external load 16 of a minimum or greater load size is plugged into the AC power outlet 26. Thus, in one or more embodiments, measuring the DC voltages from the corresponding measurement points 72 and 74 of the first and second resistive voltage dividers 66 and 68, and comparing the measured DC voltages comprises, for example, the apparatus 14 performing the steps of measuring and comparing on a periodic basis, with the period set according to a targeted response time for detecting the plugging in of an external load to the AC power outlet.

The mode control circuitry 24 is further configured to transition the AC power outlet 26 from the first mode of operation to a second mode of operation in which the AC power outlet 26 is on (energized), by activating the output switching circuitry (H-bridge 60) of the apparatus 14 that generates an AC voltage from the intermediate DC voltage.

Figure 7:
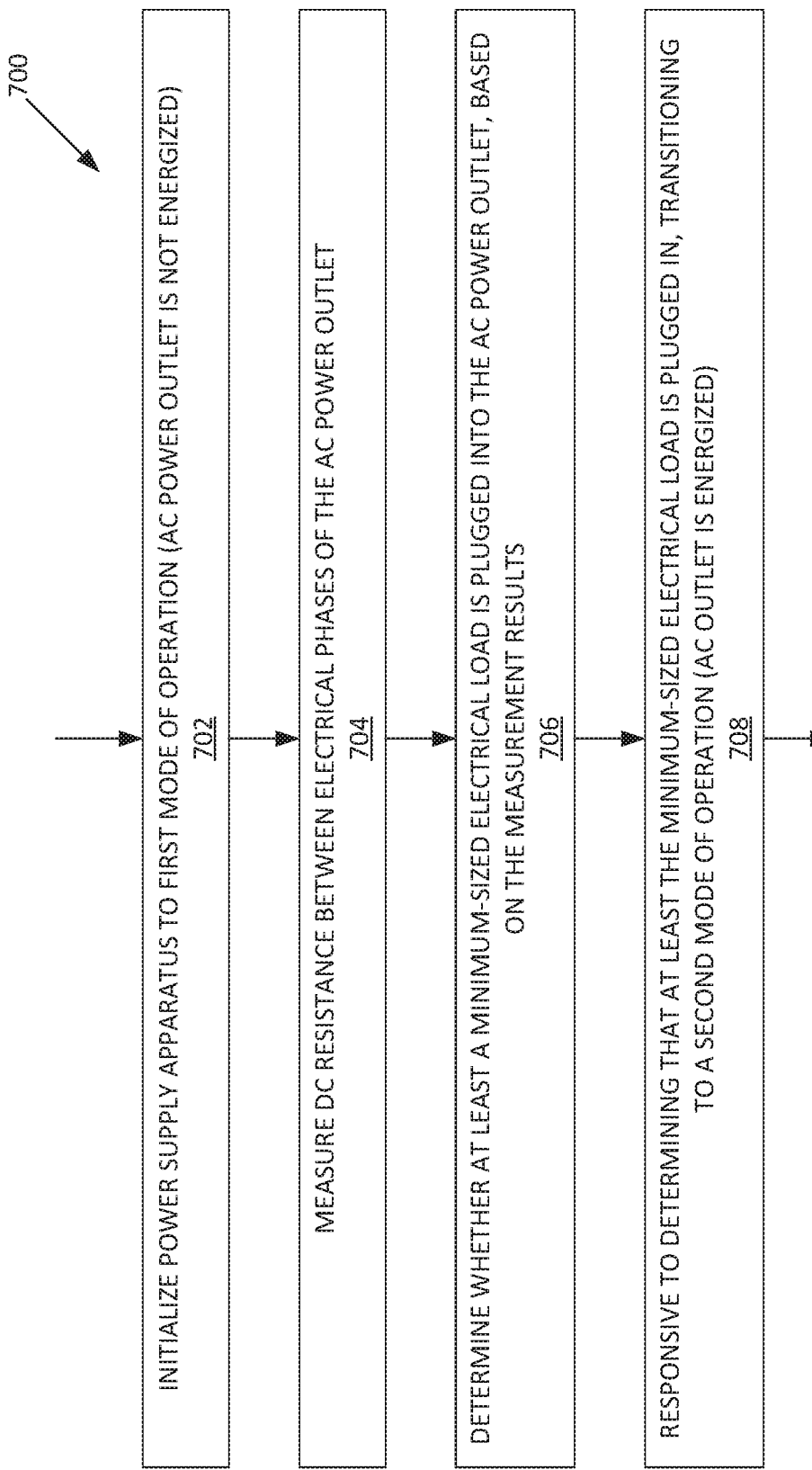
FIG. 7 is a logic flow diagram of one embodiment of a method of operation by a power supply apparatus.

FIG. 7 illustrates a method 700 of operation by a power supply apparatus 14, according to one or more embodiments. The apparatus 14 includes an AC power outlet 26 and the method 700 includes initializing (Block 702) the apparatus 14 to a first mode of operation in which the AC power outlet 26 is maintained in an off state by the apparatus 14. The method 700 further includes measuring (Block 704) a DC resistance between electrical phases of the AC power outlet 26 of the apparatus 14 and determining (Block 706) whether at least a minimum-sized electrical load 16 is plugged into the AC power outlet 26, based on the measurement results. Further, the method 700 includes, in response to determining that at least the minimum-sized electrical load 16 is plugged into the AC power outlet 26, transitioning (Block 708) the apparatus 14 to a second mode of operation, in which the AC power outlet 26 is energized.

Measuring the DC resistance between the electrical phases (Phase_A and Phase_B) associated with the AC power outlet 26 comprises, for example, measuring the DC voltages appearing at the corresponding measurement points 72 and 74 in the first and second resistive dividers 66 and 68, with the intermediate DC voltage $V_{INT}$ ($V_{BUS}$) applied directly to Phase_A and indirectly to Phase_B via the interconnecting resistor 70. That is, because the difference between $V_{72}$ and $V_{74}$ is a function of the voltage drop across the interconnecting resistor 70, where that drop, in turn, is a function of whether an external load 16 is plugged into the AC power outlet 26, the voltage difference ($V_{72}$–$V_{74}$) reflects the DC resistance between the two electrical phases.

Figure 8:
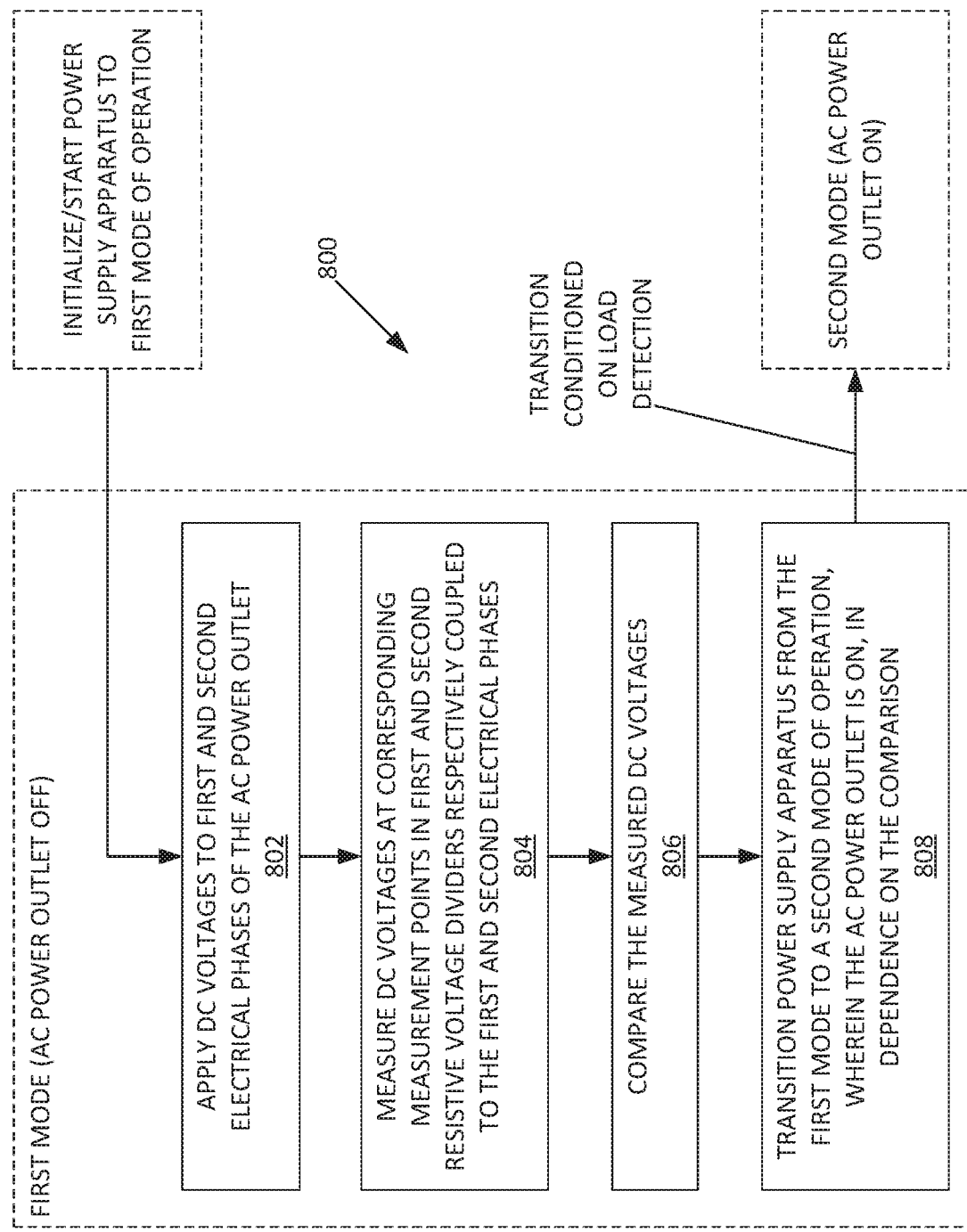
FIG. 8 is a logic flow diagram of another embodiment of a method of operation by a power supply apparatus.

FIG. 8 illustrates another embodiment of a method 800 of operation by a power supply apparatus 14, with the method 800 serving as one example of implementing the method 700. The method 800 includes applying (Block 802) DC voltages to first and second electrical phases (Phase_A and Phase_B) of the AC power outlet 26 of the apparatus 14. As described earlier, the voltage-application of Block 802 may be achieved by applying the DC voltage $V_{BUS}$ to the first electrical phase and having the second electrical phase coupled to the first electrical phase via an interconnecting resistor 70. That arrangement applies $V_{BUS}$ minus the drop across the interconnecting resistor 70 to the second electrical phase.

Because the top of the first voltage divider 66 is tied to the first electrical phase, applying the DC voltage $V_{BUS}$ to the first electrical phase means that the DC voltage $V_{BUS}$ is applied to the top of the first resistive voltage divider 66. Similarly, because the top of the second resistive voltage divider 68 is tied to the second electrical phase, applying VBUS less the drop across the interconnecting resistor 70 to the second electrical phase means that that DC voltage is applied to the top of the second voltage divider 68.

As before, the bottoms of the first and second resistive voltage dividers 66 and 68 are tied to reference ground and the resistors of the second resistive voltage divider 68 are matched at least nominally to the resistors of the first resistive voltage divider 66. Further, the interconnecting resistor 70 imposes a voltage drop between the tops of first and second resistive voltage dividers 66 and 68 that increases in the presence of an external load 16 plugged into the AC power outlet 26.

As noted elsewhere herein, the "applying" steps may be active—i.e., the apparatus 14 activates, switches, or otherwise controls one or more circuit elements to cause the voltage to be applied. However, the applying steps may be achieved according to the circuit topology, such as where a shunt resistor 66 couples the intermediate voltage to the first electrical phase of the AC power outlet 26. Of course, even in such cases, the apparatus 14 may "apply" the voltage by first activating the DC-to-DC converter 20.

The method 800 further includes measuring (Block 804) the (DC) voltages at corresponding measurement points 72 and 74 of the first and second resistive voltage dividers 66 and 68, comparing (Block 806) the measured DC voltages, and transitioning (Block 808) the apparatus 14 from the first mode of operation to a second mode of operation in which the AC power outlet 26 is on, in dependence on the comparison of the measured DC voltages. Transitioning to the second mode comprises, for example, determining whether the difference between the measured DC voltages exceeds a threshold and, responsive to the threshold being exceeded, transitioning the apparatus 14 from the first mode to the second mode. The value of the threshold corresponds, for example, to a minimum size of external load 16 (in terms of its resistive loading on the apparatus 14).

Measuring the DC voltages at the respective measurement points 72 and 74 comprises, for example, converting analog voltages at the corresponding measurement points 72 and 74 into corresponding digital counts. With that approach, comparing the measured DC voltages comprises comparing the digital counts, to determine whether the difference between the corresponding digital counts exceeds a count threshold.

Still further, the method 800 may include periodic activations/deactivations of the DC-to-DC converter 20 while the apparatus 14 operates in the first mode. When active, the DC-to-DC converter 20 outputs the intermediate DC voltage denoted as $V_{INT}$ or $V_{BUS}$, for direct application to the first electrical phase of the AC power outlet 26 and for indirect application to the second electrical phase of the AC power outlet 26 via the interconnecting resistor 70. The activation cycle is set, for example, according to a desired time-to-detection for detecting the presence of an external load 16 when it is plugged into the AC power outlet 26.

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

What is claimed is:

1. A method of operating a power supply apparatus having an AC power outlet, the method comprising:

in a first mode of operation in which the AC power outlet is maintained in an off state by the power supply apparatus:
applying a DC voltage to the top of a first resistive voltage divider coupling a first electrical phase of the AC power outlet to a reference ground;
applying the DC voltage through an interconnecting resistor to the top of a second resistive voltage divider coupling a second electrical phase of the AC power outlet to the reference ground, the second resistive voltage divider nominally matching the first resistive voltage divider and the interconnecting resistor imposing a voltage drop between the tops of first and second resistive voltage dividers that increases in the presence of an external resistive load plugged into the AC power outlet;
measuring DC voltages from corresponding measurement points of the first and second resistive voltage dividers; and
comparing the measured DC voltages; and
transitioning the power supply apparatus from the first mode of operation to a second mode of operation in which the AC power outlet is on, in dependence on the comparison of the measured DC voltages.

2. The method of claim 1, wherein the step of transitioning comprises determining whether the difference between the measured DC voltages exceeds a threshold and, responsive to the threshold being exceeded, transitioning the power supply apparatus from the first mode to the second mode.

3. The method of claim 2, wherein the value of the threshold corresponds to a minimum size of external resistive load.

4. The method of claim 1, wherein measuring the DC voltages comprises converting analog voltages at the corresponding measurement points into corresponding digital counts, and wherein comparing the measured DC voltages comprises comparing the digital counts, to determine whether the difference between the corresponding digital counts exceeds a count threshold.

5. The method of claim 1, wherein applying the DC voltage to the top of the first resistive voltage divider comprises activating a high-side transistor that switchably couples the first electrical phase to an intermediate DC voltage internally generated within the power supply apparatus, the high-side transistor switch included in a transistor bridge circuit of the power supply apparatus that is used for generating an AC output voltage from the intermediate DC voltage.

6. The method of claim 5, wherein activating the high-side transistor comprises periodically activating the high-side transistor, for periodic detection of whether an external load of at least a minimum load size is plugged into the AC power outlet, and wherein measuring the DC voltage from the corresponding measurement points of the first and second resistive voltage dividers comprises measuring the DC voltages at times synchronized with the periodic activations of the high-side transistor.

7. The method of claim 5, wherein a period of the periodic activations of the high-side transistor corresponds to a targeted response time for detecting that an external load of a minimum or greater load size is plugged into the AC power outlet.

8. The method of claim 1, wherein applying the DC voltage to the top of the first resistive voltage divider comprises passively continuously applying an intermediate DC bus voltage to the first electrical phase via a shunt resistor, the intermediate DC voltage generated internally within the power supply apparatus, for use in generating an AC output voltage to be output from the AC power outlet.

9. The method of claim 8, wherein measuring the DC voltages from the corresponding measurement points of the first and second resistive voltage dividers and comparing the measured DC voltages comprises performing the steps of measuring and comparing on a periodic basis, with the period set according to a targeted response time for detecting the plugging in of an external load to the AC power outlet.

10. The method of claim 1, wherein transitioning the AC power outlet from the first mode of operation to a second mode of operation in which the AC power outlet is on, comprises activating output switching circuitry that generates an AC voltage from an intermediate DC voltage generated internally within the power supply apparatus.

11. A power supply apparatus comprising:
an AC power outlet having first and second electrical phases;
measurement circuitry comprising:
coupling circuitry configured to apply a DC voltage to the first phase of the AC power outlet, at least during a first mode of operation of the power supply apparatus in which the AC power outlet is off;
a first resistive voltage divider coupling the first electrical phase to a reference ground;
a second resistive voltage divider coupling the second electrical phase to the reference ground, the second resistive divider matched to the first resistive voltage divider and interconnected to the first electrical phase via an interconnecting resistor that imposes a voltage drop between the tops of first and second resistive voltage dividers that increases in the presence of an external resistive load plugged into the AC power outlet;
circuitry configured to measure DC voltages from corresponding measurement points of the first and second resistive voltage dividers; and
control circuitry configured to transition the power supply apparatus from the first mode of operation to a second mode of operation in which the AC power outlet is on, in dependence on comparing the measured DC voltages.

12. The power supply apparatus of claim 11, wherein the control circuitry is configured to control the transition by determining whether the difference between the measured DC voltages exceeds a threshold and, responsive to the threshold being exceeded, transitioning the power supply apparatus from the first mode to the second mode.

13. The power supply apparatus of claim 12, wherein the value of the threshold corresponds to a minimum size of external resistive load.

14. The power supply apparatus of claim 11, wherein the circuitry configured to measure the DC voltages includes an analog-to-digital converter configured to convert analog voltages for the corresponding measurement points into corresponding digital counts, and wherein the control circuitry is configured to compare the digital counts, to determine whether the difference between the corresponding digital counts exceeds a count threshold.

15. The power supply apparatus of claim 11, wherein the coupling circuitry is a high-side transistor that, under control of the control circuitry, switchably couples the first electrical phase to an intermediate DC voltage internally generated within the power supply apparatus, the high-side transistor switch being included in a transistor bridge circuit of the power supply apparatus that is used for generating an AC output voltage from the intermediate DC voltage.

16. The power supply apparatus of claim 15, wherein the control circuitry is configured to activate the high-side transistor periodically while the power supply apparatus operates in the first mode, for periodically detecting whether an external load of at least a minimum load size is plugged into the AC power outlet, and wherein the control circuitry is configured to synchronize measurements of the DC voltage from the corresponding measurement points of the first and second resistive voltage dividers with the periodic activations of the high-side transistor.

17. The power supply apparatus of claim 15, wherein a period of the periodic activations of the high-side transistor corresponds to a targeted response time for detecting that an external load of a minimum or greater load size is plugged into the AC power outlet.

18. The power supply apparatus of claim 11, wherein the coupling circuitry is a shunt resistor that shunts an intermediate DC voltage to the first electrical phase, the intermediate DC voltage generated internally within the power supply apparatus, for generating an AC output voltage to be output from the AC power outlet.

19. The power supply apparatus of claim 18, wherein measuring the DC voltages from the corresponding measurement points of the first and second resistive voltage dividers and comparing the measured DC voltages comprises performing the steps of measuring and comparing on a periodic basis, with the period set according to a targeted response time for detecting the plugging in of an external load to the AC power outlet.

20. The power supply apparatus of claim 11, wherein the control circuitry is configured to transition the AC power outlet from the first mode of operation to a second mode of operation in which the AC power outlet is on, by activating output switching circuitry of the power supply apparatus that generates an AC voltage from an intermediate DC voltage generated internally within the power supply apparatus.

21. The power supply apparatus of claim 11, wherein the power supply apparatus includes a microprocessor configured as the control circuitry, in dependence on the execution of stored computer program instructions.

* * * * *